US006204192B1

United States Patent
Zhao et al.

(10) Patent No.: US 6,204,192 B1
(45) Date of Patent: Mar. 20, 2001

(54) PLASMA CLEANING PROCESS FOR OPENINGS FORMED IN AT LEAST ONE LOW DIELECTRIC CONSTANT INSULATION LAYER OVER COPPER METALLIZATION IN INTEGRATED CIRCUIT STRUCTURES

(75) Inventors: Joe W. Zhao, San Jose; Wei-Jen Hsia, Sunnyvale; Wilbur G. Catabay, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/281,602

(22) Filed: Mar. 29, 1999

(51) Int. Cl.⁷ .................................................. H01L 21/00
(52) U.S. Cl. ............................ 438/723; 134/1.2; 216/18; 216/67; 438/743
(58) Field of Search ............................... 134/1.2; 216/18, 216/67, 80; 438/720, 722, 723, 740, 743

(56) References Cited

U.S. PATENT DOCUMENTS

| 3,012,861 | 12/1961 | Ling | 23/223.5 |
|---|---|---|---|
| 3,178,392 | 4/1965 | Kriner | 260/46.5 |
| 3,832,202 | 8/1974 | Ritchie | 106/287 |
| 3,920,865 | 11/1975 | Läufer et al. | 427/220 |
| 4,705,725 | 11/1987 | Glajch et al. | 428/405 |
| 4,771,328 | 9/1988 | Malaviya et al. | 357/49 |
| 5,194,333 | 3/1993 | Ohnaka et al. | 428/405 |
| 5,364,800 | 11/1994 | Joyner | 437/28 |
| 5,429,710 | * 7/1995 | Akiba et al. | 438/723 X |
| 5,470,801 | 11/1995 | Kapoor et al. | 437/238 |
| 5,660,682 | 8/1997 | Zhao et al. | 438/715 |
| 5,688,724 | 11/1997 | Yoon et al. | 437/235 |
| 5,858,879 | 1/1999 | Chao et al. | 438/725 |
| 5,864,172 | 1/1999 | Kapoor et al. | 257/634 |
| 5,874,745 | 2/1999 | Kuo | 257/59 |
| 5,882,489 | 3/1999 | Bersin et al. | 204/192.35 |
| 5,888,906 | * 3/1999 | Sandhu et al. | 438/723 X |
| 5,904,154 | 5/1999 | Chien et al. | 134/1.2 |
| 5,939,763 | 8/1999 | Hao et al. | 257/411 |
| 6,025,263 | 2/2000 | Tsai et al. | 438/624 |
| 6,051,477 | 4/2000 | Nam | 438/404 |
| 6,066,574 | 5/2000 | You et al. | 438/781 |

OTHER PUBLICATIONS

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Pursuing the Perfect Low–k Dielectric", *Semiconductor International*, Sep., 1998, vol. 21, No. 10, pp. 64–66, 68, 70, 72, and 74.

* cited by examiner

Primary Examiner—William Powell

(57) ABSTRACT

A process is provided for removing etch residues from one or more openings formed in one or more layers of a low dielectric constant insulation material over a copper metal interconnect layer of an integrated circuit structure which includes cleaning exposed portions of the surface of the copper interconnect layer at the bottom of the one or more openings, the process comprising providing an anisotropic hydrogen plasma to cause a chemical reaction between ions in the plasma and the etch residues in the bottom of the one or more opening, including copper oxide on the exposed copper surface, to thereby clean the exposed portions of the copper surface, and to remove the etch residues without sputtering the copper at the bottom of the opening.

17 Claims, 4 Drawing Sheets

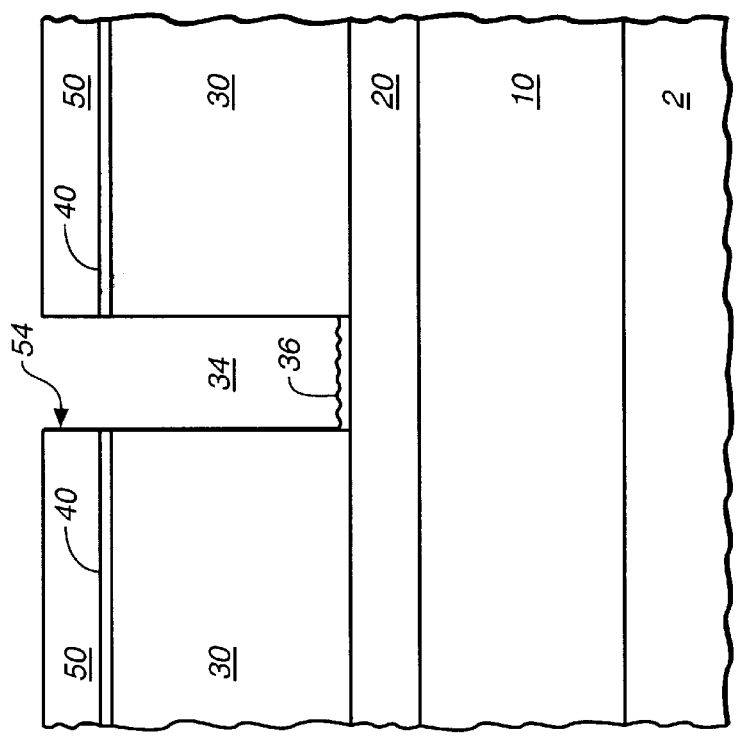
FIG._2
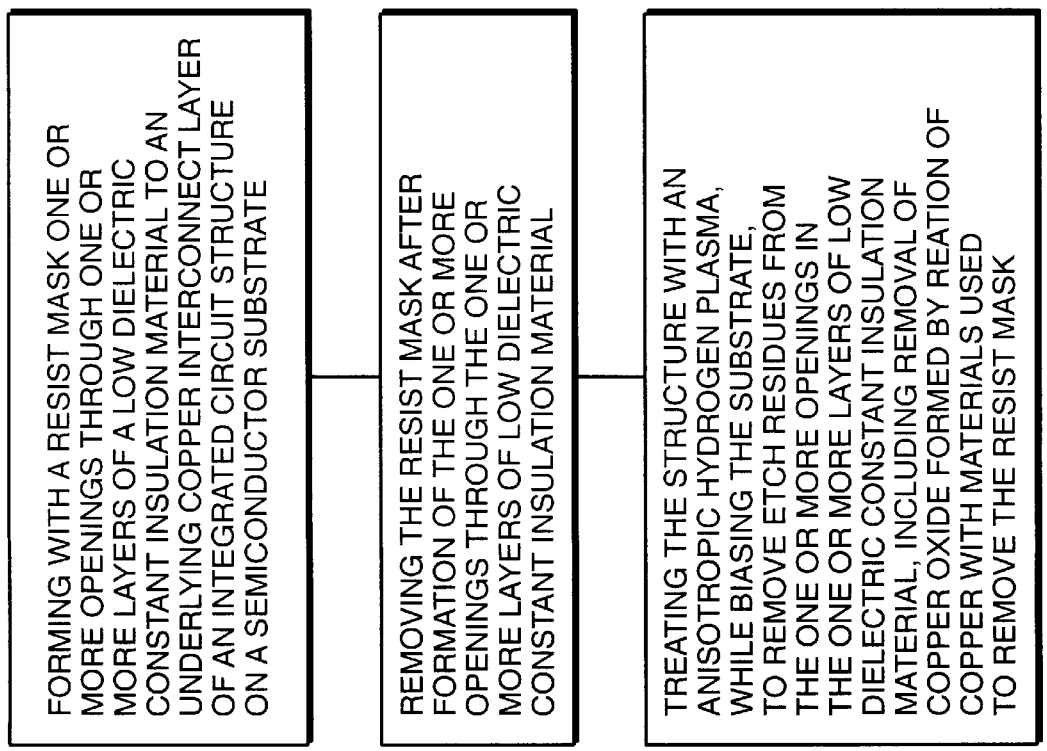
FIG._1

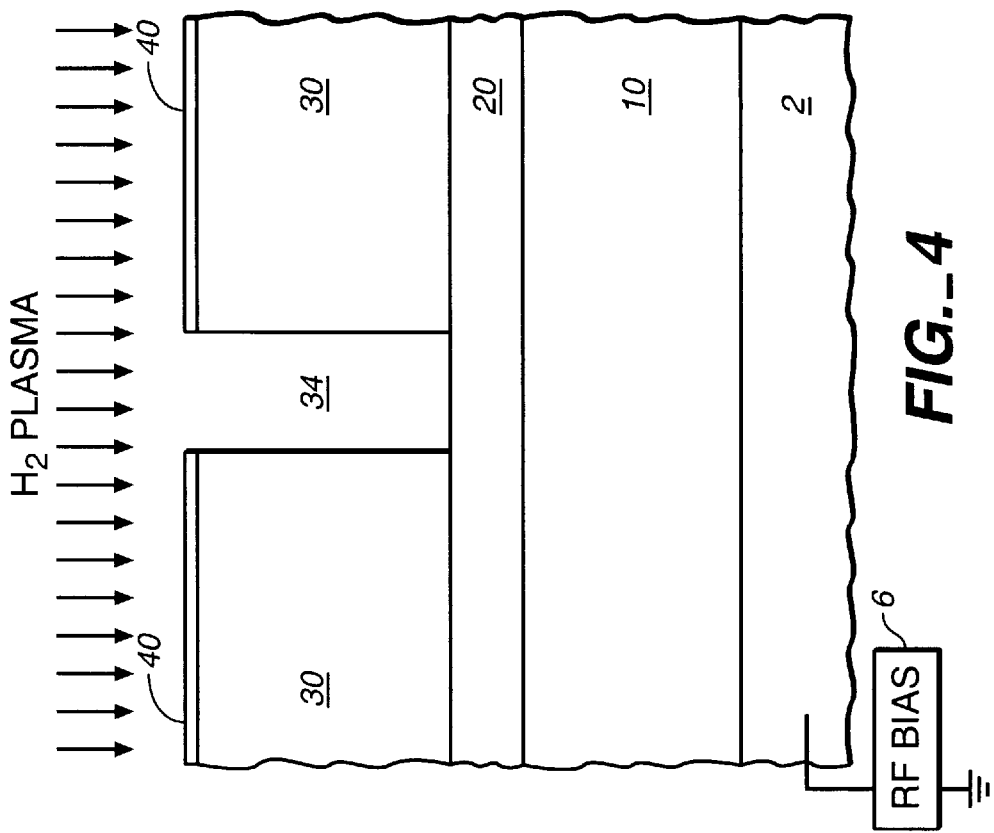
FIG._4
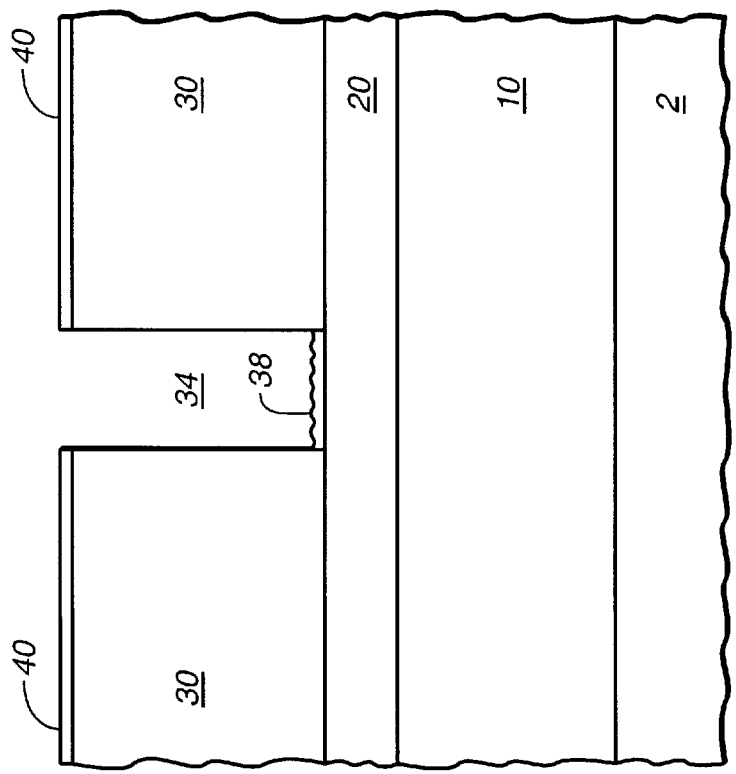
FIG._3

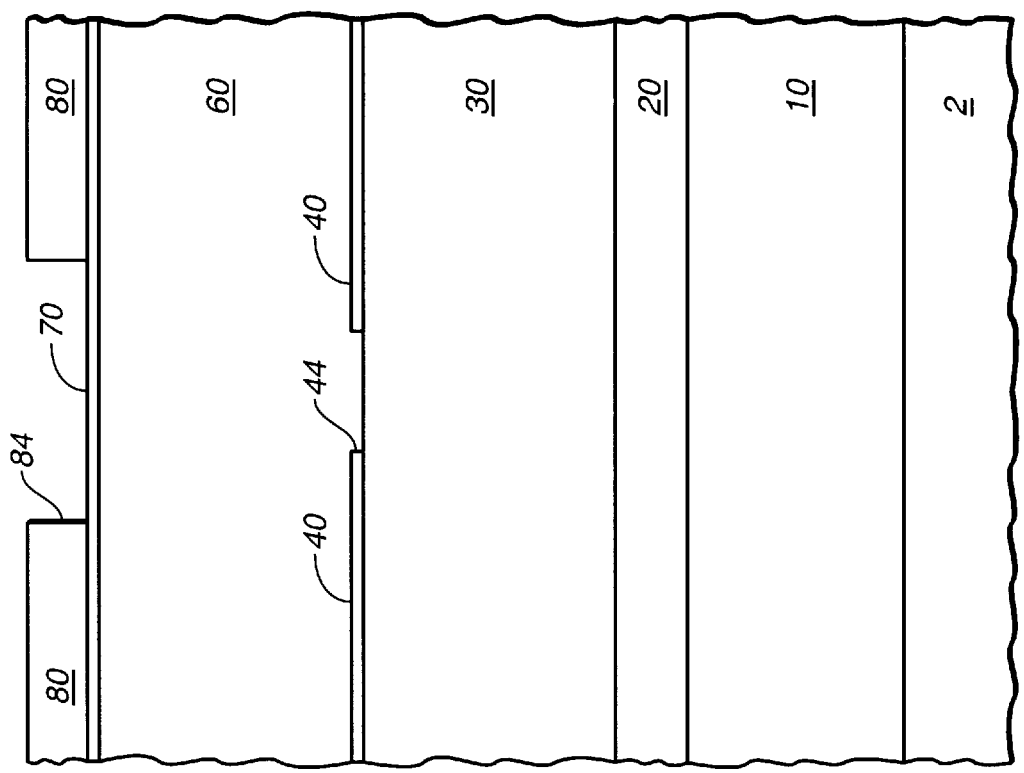
FIG._6
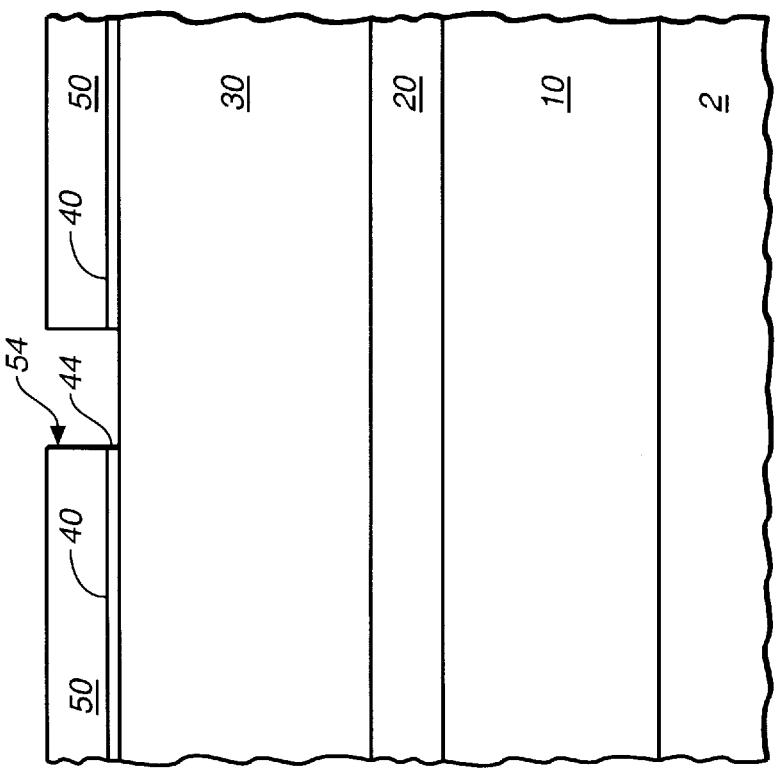
FIG._5

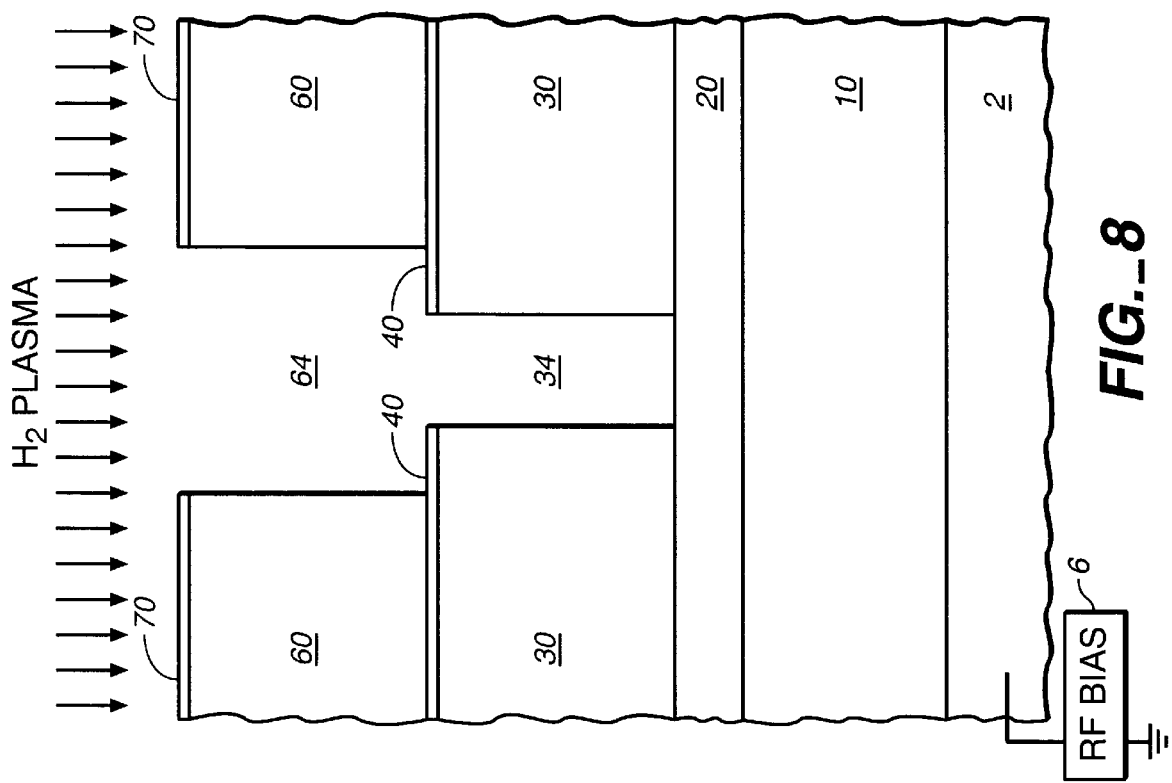
FIG._8
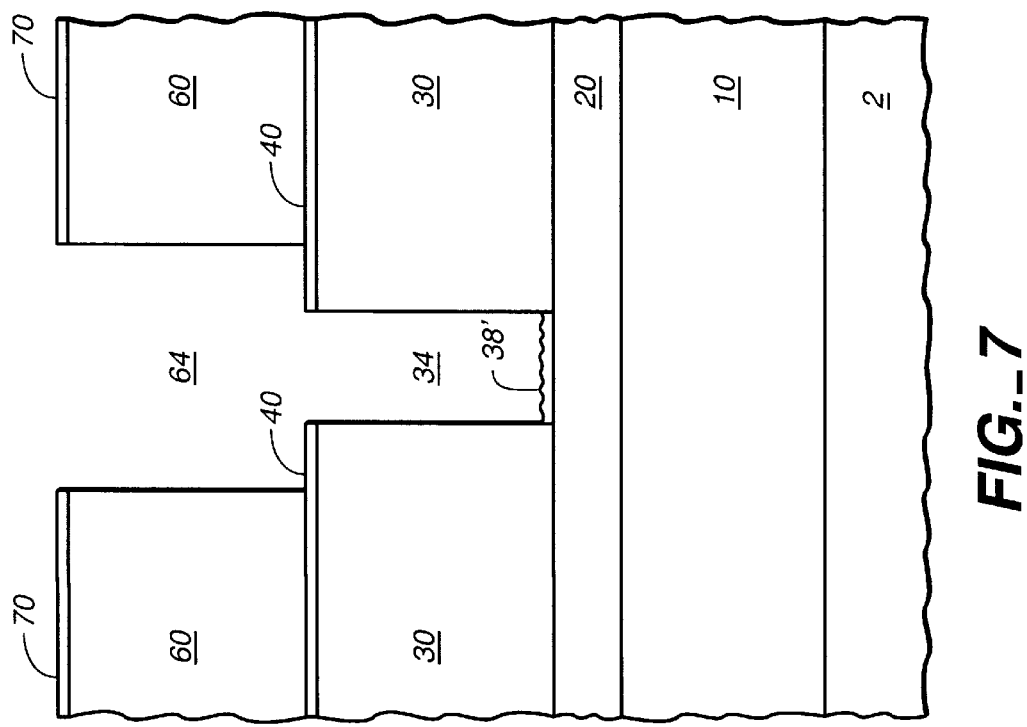
FIG._7

PLASMA CLEANING PROCESS FOR OPENINGS FORMED IN AT LEAST ONE LOW DIELECTRIC CONSTANT INSULATION LAYER OVER COPPER METALLIZATION IN INTEGRATED CIRCUIT STRUCTURES

BACKGROUND OF THE INVENTION

1. Field of the Invention

This invention relates to integrated circuit structures. More particularly, this invention relates to a process for cleaning etch residues, including copper oxides, from openings formed through one or more layers of low dielectric constant materials formed over copper metallization.

2. Description of the Related Art

In the construction of integrated circuit structures, dielectric materials such as silicon oxide ($SiO_2$) have been conventionally used to electrically separate and isolate or insulate conductive elements of the integrated circuit structure from one another. However, as the spacing between such conductive elements in the integrated circuit structure have become smaller and smaller, the capacitance between such conductive elements through the silicon oxide dielectric has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by silicon oxide insulation, as the scale of integrated circuit structures continues to reduce, the use of other insulation materials having lower dielectric constants than conventional silicon oxide ($SiO_2$) has been proposed. One such class of material is an organo silicon oxide material wherein at least a portion of the oxygen atoms bonded to the silicon atoms are replaced by one or more organic groups such as, for example, an alkyl group such as a methyl ($CH_3$—) group. Such organo silicon oxide dielectric materials have dielectric constants varying from about 2.4 to about 3.5 and are, therefore, of great interest as low dielectric constant substitutes for the conventional silicon oxide ($SiO_2$) insulation material.

While the substitution of one or more organic groups for some of the oxygen atoms bonded to the silicon atoms in a silicon oxide insulation material has a beneficial effect in the lowering of the dielectric constant of the organo silicon oxide material, therefore lowering the capacitance between conductive elements separated by such dielectric material, it has been found that the bond formed between the silicon atoms and the organic radicals is not as stable as the silicon-oxygen bond found in conventional silicon oxide ($SiO_2$) materials. In particular, for example, when the surface of such a low dielectric constant organo silicon oxide insulation layer is exposed to oxidizing or "ashing" systems, which are used to remove a photoresist mask from the low dielectric constant organo silicon oxide insulation layer, after formation of openings therein, it has been found that the ashing process results in damage to the bonds (severance) between the organic radicals and the silicon atoms adjacent the surfaces of the low dielectric constant organo silicon oxide insulation layer exposed to such an ashing treatment. This severance of the organo-silicon bonds, in turn, results in removal of such organic materials formerly bonded to the silicon atoms along with the organic photoresist materials being removed from the integrated circuit structure. The silicon atoms from which the organic radicals have been severed, and which are left in the damaged surface of the low dielectric constant organo silicon oxide insulation layer, have dangling bonds which are very reactive and become water absorption sites if and when the damaged surface is exposed to moisture.

In copending U.S. patent application Ser. No. 09/281,514, entitled "PROCESS FOR TREATING DAMAGED SURFACES OF LOW DIELECTRIC CONSTANT ORGANO SILICON OXIDE INSULATION MATERIAL TO INHIBIT MOISTURE ABSORPTION", which was filed by two of us with another Mar. 29, 1999, and is assigned to the assignee of this application, it is proposed to treat such damaged sidewalls with either a hydrogen plasma or a nitrogen plasma. Such a treatment with a hydrogen or nitrogen plasma causes the hydrogen or nitrogen to bond to silicon atoms with dangling bonds left in the damaged surface of the low dielectric constant organo silicon oxide insulation layer to replace organo material severed from such silicon atoms at the damaged surface. Absorption of moisture in the damaged surface of the low dielectric constant organo silicon oxide insulation layer, by bonding of such silicon with moisture, is thereby inhibited.

However, this problem of potential damage to the low dielectric constant organo silicon oxide insulation layer is exacerbated when copper is present as the metal interconnect below the via or opening because the etchants used to form the openings, and/or the chemical cleaning treatments used to either clean away the etch residues or remove the resist mask may also react with any exposed copper surfaces to form copper oxides which must be removed from the opening (via) prior to filling the opening with electrically conductive materials. Copper is sometimes used as the metal interconnect material (and is therefore present at the bottom of the via) because it is a superior electrical conductor to other metals such as aluminum, tungsten, or titanium commonly used as interconnect material in integrated circuit structures. Furthermore, the same desire for faster circuitry which results in the use of low dielectric constant insulation material (to mitigate speed-reducing capacitance) also gives rise to the use of copper as the interconnect metal so the presence of both copper and low dielectric constant insulation material in the same integrated circuit structures must be reckoned with.

In the past, argon plasmas have been used to remove etch residues in openings formed in conventional insulation materials such as silicon oxide ($SiO_2$) over non-copper metal interconnects. However, the use of argon as a cleaning gas may also result in undesirable sputtering of the underlying copper metal exposed by the opening. This, in turn, may result in the deposition of such sputtered copper on the low k insulation sidewalls of the via. Since copper is known to migrate into the insulation material (unlike other metals), such deposition of copper onto the sidewalls of the via must be avoided. It was recently proposed by one of us in Zhao et al. U.S. Pat. No. 5,660,682, assigned to the assignee of this invention, to use a mixture of hydrogen and argon gases for removing etch residues in place of the conventional argon plasma, but the potential for sputtering of copper by the argon in the argon hydrogen mixture still remains.

It would, therefore, be desirable to provide a process for cleaning openings such as vias, trenches, etc., formed in low dielectric constant insulation material to remove etch residues, as well as to remove copper oxide residues in such openings, without sputtering copper onto the exposed surfaces of the low dielectric constant insulation material.

SUMMARY OF THE INVENTION

In accordance with the invention, a process is provided for removing etch residues from one or more openings formed in one or more layers of a low dielectric constant insulation material over a copper metal interconnect layer of an integrated circuit structure which includes cleaning exposed portions of the surface of the copper interconnect layer at the bottom of the one or more openings, the process comprising providing an anisotropic hydrogen plasma to cause a chemical reaction between ions in the plasma and the etch residues in the bottom of the one or more openings, including copper oxide on the exposed copper surface, to thereby clean the exposed portions of the copper surface, and to remove the etch residues without sputtering the copper at the bottom of the opening.

BRIEF DESCRIPTION OF THE DRAWINGS

FIG. 1 is a flowsheet illustrating the preferred embodiment of the invention.

FIG. 2 is a fragmentary vertical cross-sectional view of an integrated circuit structure showing a resist mask used to form an opening formed in a single layer of low dielectric constant material over a copper interconnect layer of an integrated circuit structure.

FIG. 3 is a fragmentary vertical cross-sectional view of the structure of FIG. 2 after removal of the resist mask.

FIG. 4 is a fragmentary vertical cross-sectional view of the structure of FIG. 3 showing etch residues, including copper oxide residues, being removed by an anisotropic etch using a hydrogen plasma.

FIG. 5 is a fragmentary vertical cross-sectional view of another integrated circuit structure showing a first resist mask used to form an opening in a silicon nitride etch stop layer formed over a first layer of low dielectric constant material over a copper interconnect layer of an integrated circuit structure.

FIG. 6 is a fragmentary vertical cross-sectional view of the structure of FIG. 5 after removal of the first resist mask showing a second layer of low dielectric constant material formed over the silicon nitride etch stop layer and a second resist mask formed over the second layer of low dielectric constant material.

FIG. 7 is a fragmentary vertical cross-sectional view of the structure of FIG. 6 after etching of openings through both the first and second layers of low dielectric constant material and removal of the second resist mask.

FIG. 8 is a fragmentary vertical cross-sectional view of the structure of FIG. 7 showing etch residues, including copper oxide residues, being removed by an anisotropic etch using a hydrogen plasma.

DETAILED DESCRIPTION OF THE INVENTION

The invention comprises a process for removing etch residues from one or more openings formed in one or more layers of a low dielectric constant insulation material over a copper metal interconnect layer of an integrated circuit structure which comprises providing an anisotropic plasma to cause a chemical reaction between ions in the plasma and the etch residues, including copper oxide, in the opening to thereby remove the etch residues without sputtering the copper at the bottom of the opening.

a. The Embodiment of FIGS. 2–4

Turning now to FIGS. 2–4, the process of the invention is illustrated in its simplest form wherein a via is etched through a single layer of low dielectric constant insulation material formed over a copper metal interconnect and the resulting etch residues, remaining from the formation of the via and the removal of the resist mask, are removed without sputtering of the underlying copper metal.

FIG. 2 shows a semiconductor substrate 2, such as a silicon substrate, having integrated circuit structure such as transistors (not shown) formed therein with a first insulation layer 10 formed thereon and a copper interconnect layer 20 formed over first insulation layer 10. First insulation layer 10 (which forms no part of the present invention) may comprise a conventional silicon oxide ($SiO_2$) insulation material or it may comprise a low dielectric constant insulation material. Copper interconnect layer 20 comprises a conventional patterned layer of copper which serves as the first wiring level of the integrated circuit structure and is selectively connected to various contacts on the substrate by contact openings (not shown) formed through first insulation layer 10.

Formed over copper interconnect layer 20 is a layer 30 of low dielectric constant (low k) insulation material. By use of the term "low dielectric constant insulation material" is meant an insulation material having a dielectric constant below about 4.0, and preferably below about 3.5. Over low k insulation layer 30 is formed a thin protective layer 40 of a material such as silicon nitride which will serve to protect low k insulation layer 30 during subsequent removal of resist mask 50 which is formed over protective capping layer 40. Protective layer 40, which will hereinafter be referred to as silicon nitride layer 40, may range in thickness from about 15 nm to about 300 nm. Resist mask 50 is formed with one or more openings therein, illustrated by opening 54 in FIG. 2, through which low k insulation layer 30 (and silicon nitride layer 40 thereon) are etched to form via 34 shown in FIG. 2. Silicon nitride layer 40 may typically be etched through mask opening 54 using a $CHF_3$ and $O_2$ plasma, while low k insulation layer 30 may be etched with a silicon oxide etchant system such as a $CF_4$ and $H_2$ plasma or a $CF_4$, $C_4F_8$, and argon plasma.

As shown in FIG. 2, the etching of low k insulation layer 30 to form via 34 can result in the formation of some etch residues 36 in via 34 over the copper surface of the underlying copper interconnect layer. Furthermore, as shown in FIG. 3, the subsequent removal of resist mask 50 may result in further etch residues 38 in via 34 which may include copper oxide formed over the exposed copper surface in the bottom of via 34 during the removal of resist mask 50 by reaction of the resist removal chemicals with such exposed portions of copper interconnect layer 20 at the bottom of via 34. In any event, the exposed copper surface in the bottom of via 34 must be cleaned to remove such materials, including the copper oxide, prior to filling via 34 with metal to ensure formation of a good ohmic contact between copper interconnect layer 20 and the metal used to fill via 34.

Conventionally, when the underlying metal interconnect layer was aluminum or some other metal (other than copper), the metal surface was cleaned, to remove such etch residues and metal oxides, using an argon plasma. However, such an argon plasma can also result in the sputtering of some of the exposed metal at the bottom of the via. When this sputtered metal is copper, the resulting redeposition of the sputtered copper onto the via sidewalls can have deleterious effects because the copper atoms, unlike many other metals conventionally used in the construction of integrated circuit structures, will diffuse or migrate into the walls of the insulation material. Thus, it is important that such sputtering of copper be repressed or eliminated.

b. The Hydrogen Plasma Cleaning Step

In accordance with the invention, the exposed copper surfaces at the bottom of via 34 are cleaned to remove oxides and etch residues, including copper oxide residues, from via 34 by use of a hydrogen plasma wherein the hydrogen in the plasma will chemically react with the etch residues, including the copper oxide, rather than sputter the underlying copper. To clean the copper with such a hydrogen plasma, substrate 2 is placed in a high vacuum chamber where it is maintained at a pressure ranging from about 0.1 milliTorr to about 10 milliTorr, typically about 0.5 milliTorr, and at a temperature ranging from about room temperature (20° C.) up to about 300° C., and typically about 150° C. As shown at 6 in FIG. 4, a negative rf bias is applied to substrate 2 which may range from about −200 volts up to −400 volts, and typically will be about −300 volts. This negative bias is conveniently applied to substrate 2 through the substrate support (not shown) upon which substrate 2 rests in the vacuum chamber. This substrate bias is very important to ensure that the hydrogen atoms in the plasma reach the bottom of via 34, rather than bombard the sidewalls of via 34. That is, to ensure that the flow of hydrogen atoms in the via is anisotropic. This is important since the etch residues, and the copper interconnect surface to be cleaned, are at the bottom of via 34.

Hydrogen gas is then flowed into the chamber, at a flow rate equivalent to a flow of from about 1 standard cubic centimeter per minute (sccm) to about 100 sccm into a 5 liter vacuum chamber and the plasma is then ignited and maintained by a separate conventional plasma power source which may be maintained at a power ranging from about 20 watts to about 400 watts, typically about 300 watts. A small amount of nitrogen gas, e.g., about 100 sccm may also be initially flowed into the vacuum chamber to facilitate ignition of the plasma, but this flow of nitrogen is then shut off as soon as the plasma is ignited. The substrate is exposed to the plasma for a period of time sufficient to remove any remaining etch residues 36, as well as copper oxide residues 38, from the exposed portion of copper interconnect layer 20 at the bottom of via 34. Usually the cleaning time will range from about 5 seconds to about 5 minutes, and typically will be about 1 minute.

After the cleaning step is completed, the cleaned substrate may be moved, preferably under vacuum, to a physical vapor deposition (PVD) chamber where conventional processing is then carried out to form a via liner and then to fill the lined via with copper. For example, a via liner material such as, for example, tantalum metal or tantalum nitride may be sputtered over the sidewall surfaces of via 34, as well as the exposed portion of copper interconnect layer 20 at the bottom of via 34. The via may then be filled with copper using any conventional filling method. For example, a copper seed layer may be sputtered over the liner material in the via and copper may then be plated over the seed layer.

c. Optional Repair of Damaged Sidewalls of Via Prior to Cleaning

It should be noted that after formation of via 34 and after removal of resist mask 50, but prior to the cleaning process of this invention, any via sidewall damage to the low k insulation material which may have been caused either by the via etch or by the removal of the resist mask may be repaired by exposing the unbiased substrate to a hydrogen plasma whereby the hydrogen in the plasma will contact and react with the damaged low k material, as described and claimed in the aforementioned copending U.S. patent application Ser. No. 09/281,514, entitled "PROCESS FOR TREATING DAMAGED SURFACES OF LOW DIELECTRIC CONSTANT ORGANO SILICON OXIDE INSULATION MATERIAL TO INHIBIT MOISTURE ABSORPTION". This repair step would normally be carried out if the above described optional passivation step had not been carried out prior to the photoresist mask removal, or if the passivation step which had been carried out prior to the photoresist mask removal did not result in sufficient protection to the via sidewall during the photoresist mask removal.

d. The Embodiment of FIGS. 5–8

Turning now to FIGS. 5–8, the invention will be described with respect to its use with a dual layer or "dual damascene" type of structure. In this second embodiment illustrated in FIGS. 5–8, wherein like elements are labeled with the same numerals, after formation of resist mask 50, with representative opening 54 therein, an opening 44 is etched through silicon nitride layer 40, which will permit silicon nitride layer 40 to act as a mask as will be described below. However, first low k insulation layer is not etched through opening 54 in mask 50 and opening 44 in silicon nitride layer 40. Rather, resist mask 50 is then removed, followed by deposition of a second low k insulation layer 60 over silicon nitride mask 40 and the exposed portion of underlying low k insulation layer 30 through opening 44, as shown in FIG. 6.

A capping layer 70, which may be formed of the same material and of the same thickness range as silicon nitride layer 40, is then be formed over second low k insulation layer 60 to protect the upper surface of low k insulation layer 60 from the chemicals which will be subsequently used to remove a further resist mask. Second resist mask 80, having a representative mask opening 84 shown therein in FIG. 6, is then formed over silicon nitride capping layer 70.

The portion of silicon nitride capping layer 70 which is exposed through mask opening 84 is then etched through. Following this, exposed portion of second low k insulation layer 60 is then etched through opening 84 in resist mask 80 down to silicon nitride mask layer 40, and then the exposed portion of underlying low k insulation layer 30 is etched (during the same etch step and with the same etchant system) through previously formed opening 44 in silicon nitride mask layer 40. In this instance, low k insulation layers 60 and 30 are etched with a silicon oxide etchant system such as a $CF_4$, $C_4F_8$, and argon plasma which is selective to silicon nitride, i.e, an etchant system which will etch the low k insulation material in preference to etching silicon nitride.

It will be noted that opening 84 in second resist mask 80 is much wider that opening 54 in the now removed resist mask 50. This is because the opening formed in second low k layer 60 through mask opening 84 comprises a part of a trench network formed in second low k layer 60 through mask opening 84 representing the copper interconnect which will be formed in this trench network, while opening 44 in silicon nitride mask 40 represent the via which is formed through first low k insulation layer 30 to connect the copper interconnect formed in the trench network to be formed in low k layer 60 with copper interconnect layer 20 beneath low k layer 30.

Resist mask 80 is then removed, leaving etch residues and copper oxide 38, as shown in FIG. 7, on the portion of copper interconnect layer 20 exposed by the newly formed trench 64 and via 34. In accordance with the invention, such residues are removed from the trenches by exposure to the previously described hydrogen plasma cleaning step, as illustrated in FIG. 8, with substrate 2 again shown subject to a negative rf bias to ensure the anisotropic flow of the hydrogen plasma atoms to the bottom of the trenches, rather than toward the trench sidewalls. The result, as also shown in FIG. 8, is a clean opening comprising trenches and vias which are ready to be lined with a metal or conductive metal compound and then filled with copper, as in the previously described embodiment.

e. Example

To further illustrate the process of the invention, two identical silicon substrates can be constructed with low k layers 30 and 60 thereon as a part of the integrated circuit structure shown in FIG. 7, i.e., with identical trenches and vias formed in identical layers of the respective structures. One of the structures may then be subjected to a conventional argon plasma clean, while the other structure is subjected to the hydrogen plasma clean process of the invention. Both of the structures would then be subjected to the same metal filling and other processing steps to fill the respective trenches and vias in both structures with the same conductive materials, including further heating steps. If both structures are then vertically sectioned to expose the low k insulation material adjacent the sidewalls of the trenches and vias, it will be found that copper atoms, apparently sputtered by the argon cleaning plasma and then redeposited onto the sidewalls of the trenches and vias, have migrated into the low k insulation material. In contrast, in the structure cleaned by the hydrogen cleaning plasma of the invention, the low k insulation material adjacent the sidewalls of the trenches and vias would be found to be free of copper atoms, indicating that the hydrogen cleaning plasma of the invention did not sputter copper atoms, and therefore there was no redeposition of copper atoms onto the sidewalls of the trenches and vias to migrate into the low k insulation material.

Thus the invention provides a process whereby etch residues from openings formed in layers of a low dielectric constant insulation material over a copper metal interconnect layer of an integrated circuit structure can be removed, and exposed portions of the surface of the copper interconnect layer at the bottom of the openings may be cleaned using an anisotropic hydrogen plasma which causes a chemical reaction between ions in the plasma and the etch residues in the bottom of the one or more opening, including copper oxide on the exposed copper surface. Exposed portions of the copper surface will therefore be cleaned, and the etch residues will be removed without sputtering the copper at the bottom of the opening, whereby copper is not redeposited on the sidewall surfaces of the low k insulation material.

Having thus described the invention what is claimed is:

1. A process for removing etch residues from at least one opening formed in at least one layer of a low dielectric constant insulation material over a copper metal interconnect layer of an integrated circuit structure being formed on a semiconductor substrate which includes cleaning exposed portions of the surface of said copper interconnect layer at the bottom of said at least one opening, said process comprising providing a plasma to thereby remove said etch residues and to clean said exposed portions of said copper surface without causing copper to deposit on the sidewalls of said at least one opening formed in said at least one layer of said dielectric constant insulation material.

2. The process of claim 1 wherein said step of providing a plasma to thereby remove etch residues and to clean said exposed portions of said copper surface without causing copper to deposit on said sidewalls of said at least one opening further comprises providing a plasma capable of cleaning said exposed portions of said copper surface and removing said etch residues without sputtering the copper at the bottom of said at least one opening formed in said at least one layer of said low dielectric constant insulation material.

3. The process of claim 1 wherein said step of providing a plasma to thereby remove etch residues and to clean said exposed portions of said copper surface without causing copper to deposit on said sidewalls of said at least one opening formed in said at least one layer of said low dielectric constant insulation material further comprises providing a hydrogen plasma.

4. The process of claim 3 wherein said step of providing a hydrogen plasma to thereby remove etch residues and to clean said exposed portions of said copper surface without causing copper to deposit on said sidewalls of said at least one opening formed in said at least one layer of said low dielectric constant insulation material further comprises providing an anisotropic hydrogen plasma.

5. The process of claim 4 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material further comprises applying a bias to said substrate to assist said anisotropic hydrogen plasma in reaching the bottom of said at least one opening adjacent said copper surface.

6. The process of claim 1 wherein said step of providing a plasma to thereby remove etch residues and to clean said exposed portions of said copper surface without causing copper to deposit on said sidewalls of said at least one opening further comprises causing a chemical reaction to occur between ions in said plasma and said etch residues in the bottom of said at least one opening formed in said at least one layer of said low dielectric constant insulation material.

7. The process of claim 1 wherein said step of providing a plasma to thereby remove etch residues and to clean said exposed portions of said copper surface without causing copper to deposit on said sidewalls of said at least one opening formed in said at least one layer of said low dielectric constant insulation material is preceded by a step of passivation, wherein said passivation step comprises treating said sidewalls of said at least one opening with a plasma selected from the group consisting of nitrogen plasma, oxygen plasma, and a combination of nitrogen and oxygen plasmas.

8. The process of claim 1 wherein said step of providing a plasma to thereby remove etch residues and to clean said exposed portions of said copper surface without causing copper to deposit on said sidewalls of said at least one opening formed in said at least one layer of said low dielectric constant insulation material, is preceded by a step of repair, wherein said repair step comprises treating said sidewalls of said at least one opening with a hydrogen plasma, without applying a bias to said substrate.

9. A process for removing etch residues from at least one opening formed in at least one layer of a low dielectric constant insulation material over a copper metal interconnect layer of an integrated circuit structure being formed on a semiconductor substrate which includes cleaning exposed portions of the surface of said copper interconnect layer at the bottom of said at least one opening, said process comprising providing an anisotropic hydrogen plasma to cause a chemical reaction between ions in the plasma and the etch residues in the bottom of said at least one opening, including copper oxide on said exposed copper surface, to thereby clean said exposed portions of said copper surface and to remove said etch residues without sputtering the copper at the bottom of said at least one opening and without causing copper to deposit on the sidewalls of said at least one opening.

10. The process of claim 9 which further includes applying a bias to said substrate to provide said anisotropic hydrogen plasma which reaches to the bottom of said at least one opening formed in said at least one layer of said low dielectric constant insulation material adjacent said copper surface.

11. The process of claim 9 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material is preceded by a step of passivation, wherein said passivation step comprises treating said sidewalls of said at least one opening with a plasma selected from the group consisting of nitrogen plasma, oxygen plasma, and a combination of nitrogen and oxygen plasmas.

12. The process of claim 9 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material is preceded by a step of repair, wherein said repair step comprises treating said sidewalls of said at least one opening with a hydrogen plasma, without applying a bias to said substrate.

13. A process for removing etch residues from at least one opening formed in at least one layer of a low dielectric constant insulation material over a copper metal interconnect layer of an integrated circuit structure substrate which includes cleaning exposed portions of the surface of said copper interconnect layer at the bottom of said at least one opening formed in said at least one layer of said low dielectric constant insulation material, said process comprising:

a) providing an anisotropic hydrogen plasma to cause a chemical reaction between ions in the plasma and the etch residues in the bottom of said at least one opening formed in said at least one layer of said low dielectric constant insulation material, including copper oxide on said exposed copper surface, to thereby clean said exposed portions of said copper surface and to remove said etch residues without sputtering the copper at the bottom of said at least one opening, and without causing copper to deposit on the sidewalls of said at least one opening; and b) applying a negative bias, ranging from about −200 volts to about −400 volts, to said substrate to urge said anisotropic hydrogen plasma to reach the bottom of said at least one opening adjacent said copper surface.

14. The process of claim 13 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material, is preceded by a step of passivation, wherein said passivation step comprises treating said sidewalls of said at least one opening with a plasma selected from the group consisting of nitrogen plasma, oxygen plasma, and a combination of nitrogen and oxygen plasmas.

15. The process of claim 13 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material, is preceded by a step of repair, wherein said repair step comprises treating said sidewalls of said at least one opening with a hydrogen plasma, without applying a bias to said substrate.

16. The process of claim 13 wherein said step of providing an anisotropic hydrogen plasma to thereby remove etch residues and to clean said exposed portions of said copper surface without causing copper to deposit on said sidewalls of said at least one opening formed in said at least one layer of said low dielectric constant insulation material, is followed by a step of physical vapor deposition to form a via liner on at least said sidewalls of said at least one opening.

17. The process of claim 16 wherein said step of physical vapor deposition to form a via liner on at least said sidewalls of said at least one opening formed in said at least one layer of said low dielectric constant insulation material further comprises depositing tantalum on at least said sidewalls of said at least one opening.

\* \* \* \* \*